United States Patent [19]

Beelitz et al.

[11] 4,199,860
[45] Apr. 29, 1980

[54] METHOD OF INTEGRATING SEMICONDUCTOR COMPONENTS

[75] Inventors: Howard R. Beelitz, Gillett, Pa.; Donald R. Preslar, Somerville, N.J.

[73] Assignee: RCA Corporation, New York, N.Y.

[21] Appl. No.: 850,672

[22] Filed: Nov. 11, 1977

[51] Int. Cl.² ............................................. B01J 17/00
[52] U.S. Cl. ..................................... 29/577 C; 29/580; 357/15
[58] Field of Search ..................... 29/576 W, 577, 580; 357/15, 56

[56] References Cited

U.S. PATENT DOCUMENTS 3,623,925  11/1971  Jenkins .................................... 357/48
3,818,583  6/1974   Polata ..................................... 29/580
4,063,271  12/1977  Bean ....................................... 357/56

Primary Examiner—W. C. Tupman
Attorney, Agent, or Firm—Edward J. Norton

[57] ABSTRACT

A dielectric-isolated PNP transistor with Schottky protection, either alone or as one of an integrated pair of complementary bipolar transistors has complete dielectric isolation from neighboring devices and from the substrate by means of a topside anisotropic etch. This leaves the devices in mesa form, thinner versions having the facility of lateral terminations, e.g. for the collector. The method is advantageously adapted to provide single type or complementary bipolars with integrated Schottky barrier protection.

9 Claims, 4 Drawing Figures

SCHOTTKY-CLAMPED NPN TRANSISTOR    NON-CLAMPED PNP TRANSISTOR

METHOD OF INTEGRATING SEMICONDUCTOR COMPONENTS

The present invention relates to PNP bipolar transistors and their protection by shunt Schottky barriers.

This invention also relates to producing what are usually termed complementary bipolar pairs (e.g. NPN and PNP devices) integrated on a unitary substrate. There are many advantages in having the devices individually isolated by a dielectric material and/or air rather than by PN-junctions as is common. The instant invention further concerns producing one or both devices of such a pair with an auxiliary or integrated Schottky diode shunted between the collector(s) and the base(s). The devices of the pair are complementary as regards conductivity, but need not be completely symmetrical or matching in their opposite characteristics.

In MOS-FET (field effect) technology, transistors of opposite conductivity type, leading to low standby power dissipations, can be readily prepared. Analogous techniques with bipolars have not so far gained similar acceptance because of significantly increased process complexity. Concurrent formation of high performance PNP and NPN bipolars has proven difficult and costly, while making the PNP transistor of the vertical substrate type or of the lateral type leads to inferior performances.

The integration of a Schottky diode with a transistor, to shunt the collector base junction thereof, increases performance, particularly at high currents and frequencies, e.g. switching frequencies, by limiting the device storage time and reverse voltages without the need for gold doping. However, applying this to high performance PNP transistors leads to problems and complexity.

The invention aims to produce a complementary bipolar pair in a reproducible manner leading to dielectrically isolated mesa devices, and moreover easily adaptable to devices with integrated Schottky protection. The invention also seeks to enable Schottky-protected PNP bipolars to be produced without undue complexity in method steps.

In the side-sectional diagrammatic drawings.

Figure 1:
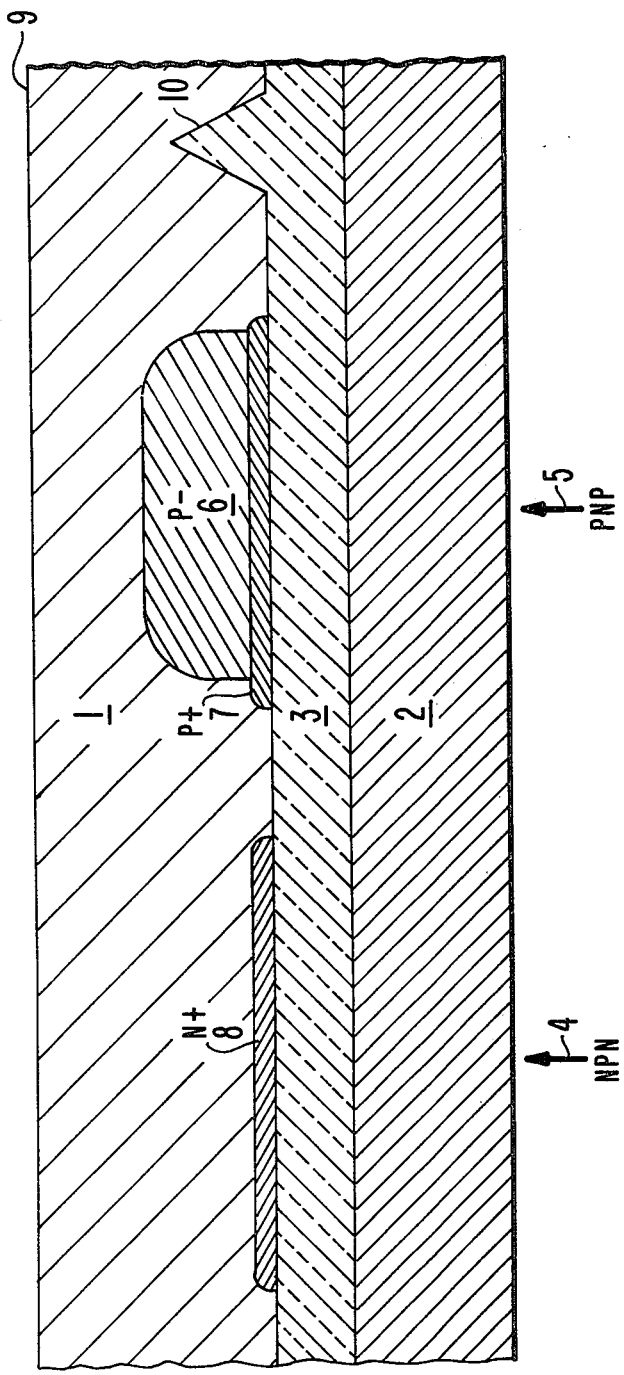
FIG. 1 is a partial cross-section of a wafer at an early stage in making a complementary bipolar pair.

FIG. 1 shows a stage in the construction of either one or both of an IC complementary bipolar pair, in which one or both bipolars may be Schottky-protected. The construction makes use of anisotropic etch techniques for enabling dielectric isolation. As far as possible, stages in producing the NPN transistor of the pair should be accompanied by advancement of the PNP transistor formation, in the interests of economy of stages, time and material.

The starting material, as illustrated by FIG. 1 is an N$--$ bulk wafer 1, preferably of monocrystalline silicon, of conductivity chosen in view partly of the two to seven micrometers ($\mu$m) of silicon adjacent to the upper surface 9 which are to serve as the collector for NPN transistors. The PNP transistors are of primary interest, since they are not Schottky-protected so easily as NPN transistors, but steps in the NPN production should be compatible with the starting materials and steps of the PNP preparation.

In some embodiments, the final thickness of the bulk N$--$ material decides the all-important base width of the PNP transistors, while in other embodiments there is an N base formed by diffusion or ion-implantation. In any case, the thickness of the bulk material should be predictable to a tolerance of one micrometer or so after the preparation. The preparation in general comprises polishing and lapping.

The N$--$ designation of the bulk silicon material generally indicates facility to form Schottky barrier layers with applied aluminum, or with other metals such as palladium or platinum. Also the other P type regions have to be produced from the N material, so that light N$--$ doping leaves the conversion less onerous.

Conventional epitaxially produced material could supply the N$--$ starting material but it is not recommended because the bulk wafer approach is both simpler and cheaper and will usually present higher degrees of crystalline perfection, leading to better devices. Equally important is that the preferred embodiments involve diffusions or ion-implantations into both major surfaces of the bulk, and an epitaxial layer would have to be separated from its substrate.

FIG. 1 shows a wafer handle 2 which may be of polycrystalline silicon attached to the lower side of bulk wafer 1 by means of an oxide layer 3. Arrows 4 and 5 show the center of sites on the wafer destined to contain an NPN and a PNP bipolar transistor, respectively, for an eventual complementary-symmetry pair.

Before the attachment of the wafer handle 2 as illustrated, a P$-$ collector region 6 is locally defined, and diffused. Optionally, a P+ region 7 is diffused or implanted, for minimizing $R_{sat}$, the internal resistance at current saturation of the transistor, when minimum voltage drop is often required. Gallium rather than boron is preferably used for the P+ region 7 because it diffuses less readily away from its alloted volume at 7 during subsequent thermal processing operations. The diffusion can alternatively be allowed for by ion-implanting region 7 to be initially even smaller than shown; automatic out-diffusion subsequently will cause it to assume the illustrated volume.

The diffusion from the lower side as viewed, in contrast to producing P$-$ region 6 via the upper side, causes the concentration of impurities to be maximized at the lowermost surface, which is the most advantageous and sometimes the P+ pocket 7 is thus rendered completely unnecessary. The lower P doping at the inner surface of region 6 also facilitates the subsequent formation of emitter and base regions and causes less tendency to punch-through to the emitter or other voltage breakdowns for base regions of given width.

Further regions are produced in the lower surface of the N$--$ wafer 1 before the handle 2 is applied. The further regions will form N+ buried pockets such as that shown at 8. The extra N impurities, such as antimony, are diffused in at the locality of arrow 4 and will become part of the collector termination for the NPN transistor, which will have a collector of the N$--$ conductivity of the original bulk. The N+ pocket thus effectively reduces the series resistance of the collector.

This N+ region would be most inconvenient to produce if only the top surface 9 were ever accessible.

The regions 6, 7, and 8 do not have to be very accurately defined because their areas will be later reduced somewhat by an anisotropic etch producing mesas and separating each device from the next, mostly by air. In embodiments where they have to be accurately defined, keys 10 have to be produced in the lower surface of the wafer first of all. The keys are then used to locate one or more masks for accurate definitions and alignments of the diffusions or implantations. In this embodiment, the regions are produced first as indicated and then the keys 10 are prepared.

Each key 10 is located by defining an alignment hole (not shown as such) in the lower side of the wafer 1. Keys such as that shown at 10 are then anisotropically etched to a required accurate depth. This sort of etching follows crystal boundaries so that the inclination of the holes is fixed and their depth can be calculated from observed cross-sections. These holes will serve as thickness indicators when the wafer is thinned, by observation of the holes from the top surface; and as registration guides for any subsequent step needing accurate alignment notably of locations on the top surface of the wafer 1 with locations on the bottom surface thereof, e.g., the producing of the mesas from the top surface.

After the lower surface treatment is terminated, the oxide layer 3 is formed to cover all of the above mentioned regions and keys. The thickness of the oxide layer 3 is chosen for optimum attachment of the wafer handle 2 by thermal lamination but it is not critical. Unlike the single crystal bulk of the wafer 1, the wafer handle 2 is preferably of the same material, i.e. silicon, but polycrystalline. Techniques are well-known, especially in power semiconductor device technology, for wafer handle attachment. Accordingly, the polycrystalline wafer 2 is also suitably coated with oxide and is then laminated to the wafer 1 by means of heat and pressure.

The resulting composite structure is what is actually shown in FIG. 1 and is now ready for thinning of the wafer to a desired thinness and accuracy as mentioned above. This is achieved by lapping and polishing, alone or followed by a chemical etch as required.

Figure 2:
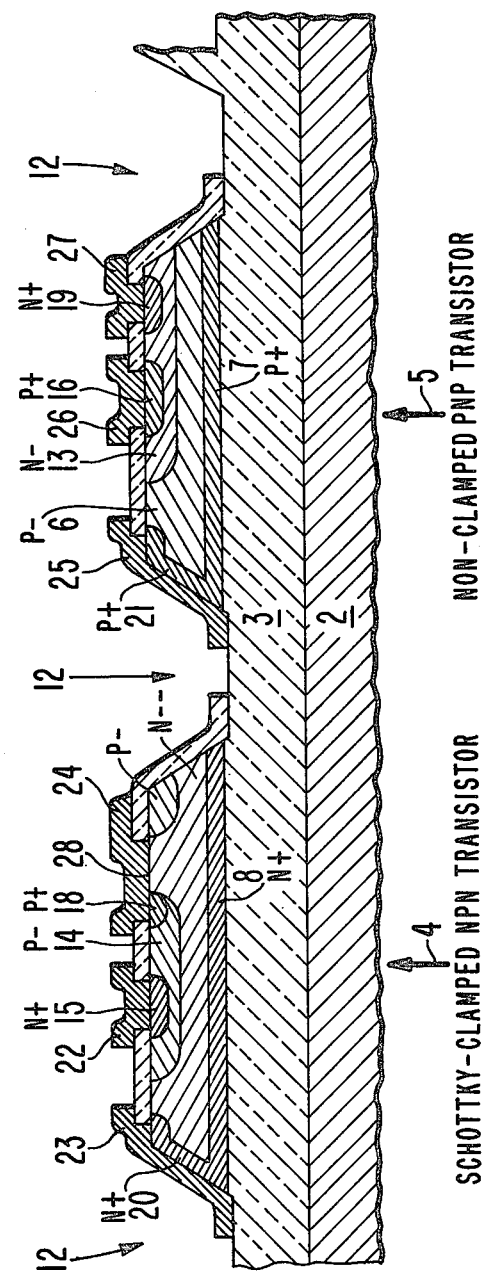
FIG. 2 is a partial cross-section showing a complementary pair with one (an NPN) transistor Schottky-clamped.

Referring to a complementary-pair structure completed from the starting structure of FIG. 1 and illustrated in FIG. 2, the prepared wafer 1 with its handle 2 receives its topside treatment which commences with another stage of anisotropic etches, located as shown by arrows 12, to yield mesa forms for the devices with sloping sides communicating with the N+ buried pocket 8 and with the P+ pocket 7, if provided. This etch uses the previously etched keys 10 for location, alignment and depth. An N+ base 13 for the PNP device 5 is diffused into the previously formed P− region 6 and a P− base 14, preferably of ion-implanted boron, is produced in the NPN device 4. An N+ emitter 15 and a P+ emitter 16 are next produced, the N+ emitter being produced by implantation or diffusion but the P+ emitter again being implanted if there is a desire for accurately controlling junction depths and avoiding high temperature process interactions between the device types. The P+ emitter step is used for simultaneously producing a P+ base contact region 18 for the NPN transistor 4 and the N+ emitter step is used for simultaneously producing a base contact region 19 for the PNP transistor 5.

Collector contacting may be by diffusions 20, 21 down the sides of the mesas but it will sometimes not be feasible for thicker mesas (e.g. 5–7 μm or more) which are typical for linear high-voltage transistors. The grooves between the mesas may then have to be filled with polycrystalline silicon, restricting collector contacting to the topside surface. With mesas of 2–4 μm in thickness as used in digital work, sidewall diffusions 20, 21 as shown will be advantageous. Diffusion 20 can be made during the stage at which the N+ emitter 15 is produced, and 21 can be made with the P+ emitter 16.

Terminal metallizations 22–27 are now applied, at least that referenced 24 being a Schottky forming metal, and bridging the P+ base contact region 18 and the N− − collector region derived from the original bulk wafer 1. The N− − collector region has doping so low that the metallization forms an integrated Schottky barrier 28 therebetween. Passivating oxide layers are produced before the metallization stage, in known manner.

Thus, there can be produced by the above method a truly compatible NPN-PNP bipolar integrated pair, the first being Schottky diode clamped to yield a low storage time, high performance, non-saturating transistor.

If the PNP transistor is also desired to be Schottky protected, a separate or discrete Schottky diode on or off the chip can be appropriately shunted across the collector/base of device 5. Alternatively, an integral Schottky device shunting a PNP transistor can be prepared as follows, reference being made to FIG. 3 or 4 which show such integrated circuit PNP devices.

Figure 3:
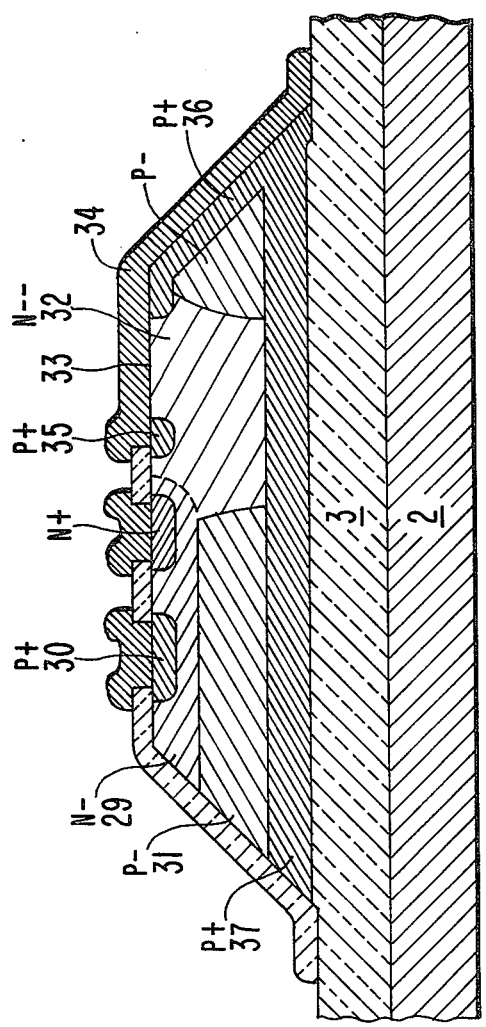
FIG. 3 shows a PNP bipolar transistor having an integrated Schottky clamp.

In FIG. 3 there is shown a PNP transistor with a combination N− − and N− base region. The N− part 29 is diffused as was the wholly N− base of FIG. 2, and serves as the main minority carrier passing portion between an emitter 30 and a collector 31, while the N− − base portion 32 is part of the original monocrystalline bulk and forms a shunting Schottky barrier 33 with a Schottky forming metallization 34. A P+ guard band 35 is used in known manner to control the reverse breakdown voltage of the Schottky barrier 33. The region 36 leads from terminal metal 34 to a P+ buried pocket 37 produced initially into the lower surface as was the optional buried pocket 7 in FIGS. 1 and 2. The P− collector 31 is also produced as in FIGS. 1 and 2 from the lower side. Cross-hatching shows oxide protection layers and base and emitter metallization and contacting are conventional.

The NPN device will be as for FIG. 2 and the most important contrast between the two complementary transistors is that the Schottky contact is formed with the collector region in the NPN and with the base region in the PNP. The N− − could be epitaxial starting material as before but it is again envisaged that a single-crystal wafer will be most economical and efficacious. Also as before, the effective N− base region 29 is again produced by implanted or diffused N impurities into the already prepared N− − bulk to provide N−, so that the thickness of the base (a key factor in the electrical properties of the device) does not depend primarily on the accuracy of the lapping or polishing during preparation.

Figure 4:
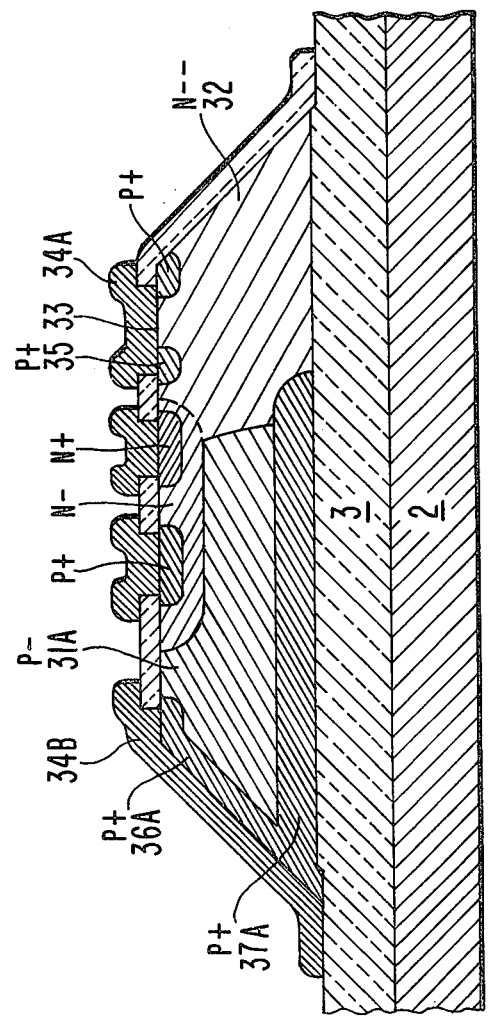
FIG. 4 shows a PNP bipolar transistor device with an integrated Schottky diode accessible for an external clamping connection.

Another Schottky-clamped PNP bipolar is seen in FIG. 4; only in this the Schottky metallization 34A to the base does not now contact the collector 31A; instead a P+ collector contact region 36A is formed on the left hand lateral of the mesa and a collector metallization 34B is produced thereon. Thus the Schottky and collector metallizations 34A, 34B are now separately accessible, or could be joined, or commoned to form an integral structure by further insulated bridging metallization (not shown) if required. The collector region 31A now extends to the top surface to prevent the collector contacting P+ region contacting the N− base, and, as in FIG. 2, the P+ buried pocket 37A serves not as a series connection but only as an $R_{sat}$ reducing artifice, and so is likewise optional.

The above embodiments provide Schottky protected complementary symmetry bipolars with full dielectric and air isolation. The V-grooves are preferable but not essential to the latter feature.

Complementary bipolars integrated with dielectric isolation are known from U.S. Pat. No. 3,818,583, but the sloping sides are provided by V− groove formation into the bottom surface and therefore are not used to form mesas; lateral contacting was also therefore not considered or enabled. Schottky protection was not a factor in this reference. U.S. Pat. No. 3,623,925 proposes NPN transistors with integrated Schottky clamps, but did not suggest a complementary symmetry bipolar pair, or dielectric isolation, or forming a Schottky barrier either with a base region or with a PNP bipolar. Our described embodiments are consequently readily appreciated to benefit substantially from the topside V− groove etching and the greater Schottky protection envisaged to supplement the full dielectric protection.

What is claimed is:

1. A method of integrating semiconductor components comprising:
    providing as starting bulk material a semiconductor single crystal body of low conductivity and having opposed major surfaces,
    producing a collector region of the opposite conductivity at a first location in one of said surfaces and defining a collector region of said starting material at a second location in said one surface spaced from said first location,
    insulatedly attaching a wafer handle to said one surface,
    producing a base region, a base contact portion in the base region and an emitter region in the second major surface at each of said first and second spaced locations, the base contact portion at each location being produced simultaneously with the emitter region at the other location,
    applying a Schottky barrier metallization to said starting material at one of said spaced locations on said second surface to form by virtue of the low conductivity of said material an integrated Schottky barrier,
    applying associated terminal metallizations, and
    anisotropically etching into said second surface as far as said one surface to form boundaries for surrounding said locations to thereby dielectrically isolate a complementary pair of semiconductor components in mesa form.

2. A method according to claim 1 comprising before attaching said handle, forming a low resistivity pocket on at least one collector region at said one surface whereby subsequently to provide a buried pocket.

3. A method according to claim 2 comprising forming a second low resistivity pocket located on a sloping side of a mesa formed by said etching, said second pocket contacting the first pocket.

4. A method of making a Schottky protected PNP bipolar transistor comprising:
    providing a single-crystal semiconductor wafer as a bulk starting material of N− − conductivity and having opposed major surfaces,
    forming a P− collector region over a limited area in one major surface of the wafer,
    insulatedly attaching a wafer handle to said one surface to be used for the following steps:
    forming an N− base portion in the N− − starting material in and at said opposite surface to lie superjacent the P− region, the unconverted N− − starting material completing an N type base region,
    forming a P type emitter in said N− base portion,
    applying a Schottky barrier forming metallization at said opposite surface to the residual N− − material completing said base region, and
    anisotropically etching into said opposite surface as far as said one surface to provide an isolation moat and mesa formation for the PNP component, at any stage after the wafer handle attaching stage and to allow a surface communication with said P− region.

5. A method according to claim 4 comprising:
    so forming the P− collector region that it does not reach said opposite surface of the wafer.

6. A method according to claim 5 comprising:
    before attaching the wafer handle, forming a P+ collector contacting pocket at said one major surface, and subsequently
    forming a further P+ contacting region at the lateral surface of said mesa extending down enough to contact said P+ pocket at the one major surface.

7. A method according to claim 6 comprising:
    applying the Schottky metallization so that it bridges the N− − bulk to form the Schottky barrier and the further P+ contacting material at the lateral communication surface to form an ohmic contact thereat; thereby also integrating a Schottky protection diode.

8. A method according to claim 4 comprising terminating the P− type collector region with separate metallization from that which forms the Schottky barrier with said N− − material.

9. A method according to claim 4 comprising:
    also producing integral on the same wafer but dielectrically isolated an NPN transistor with a common electrode forming a Schottky barrier with said N− − wafer bulk material,
    said common electrode also ohmically contacting the P type base of said NPN transistor.

* * * * *